(12) United States Patent
Gailhard

(10) Patent No.: US 11,336,268 B2
(45) Date of Patent: May 17, 2022

(54) INTEGRATED CIRCUIT COMPRISING AT LEAST ONE RING OSCILLATOR AND METHOD FOR CONTROLLING AN OPERATION OF THE OSCILLATOR

(71) Applicant: STMicroelectronics (Rousset) SAS, Rousset (FR)

(72) Inventor: Bruno Gailhard, Peypin (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 17/128,890

(22) Filed: Dec. 21, 2020

(65) Prior Publication Data
US 2021/0211120 A1 Jul. 8, 2021

(30) Foreign Application Priority Data
Jan. 2, 2020 (FR) ...................................... 2000011

(51) Int. Cl.
*H03K 3/03* (2006.01)
*H03K 5/01* (2006.01)

(52) U.S. Cl.
CPC ............. *H03K 3/0315* (2013.01); *H03K 5/01* (2013.01)

(58) Field of Classification Search
CPC .................................................... H03K 3/0315
USPC ............................................................ 331/57
See application file for complete search history.

(56) References Cited

U.S. PATENT DOCUMENTS

| 2014/0104005 A1 | 4/2014 | Zhang |
| 2015/0241955 A1 | 8/2015 | Kosonocky et al. |
| 2020/0183486 A1* | 6/2020 | Kapoor ................... G06F 1/324 |

OTHER PUBLICATIONS

Shamjad, T., A., et al., "Analysis and design of the Temperature Indepent Methodologies for Advanced CMOS Circuits, LSI (PT-2010)," May 1, 2013, pp. 281.

Zu, Y. et al.,"TI-States Processor Power Management in the Temperature Inversion Region," 2016 49th Annual IEEE / ACM International Symposium on Microarchitecture, Oct. 15, 2016, pp. 1-13.

* cited by examiner

Primary Examiner — Joseph Chang
(74) Attorney, Agent, or Firm — Slater Matsil, LLP

(57) ABSTRACT

Integrated circuit, comprising at least one ring oscillator including a succession of inverters looped back to form the ring, the at least one oscillator being intended to operate at a desired output frequency and configured so that the inverter transistors operate in or near their temperature inversion zone.

30 Claims, 7 Drawing Sheets

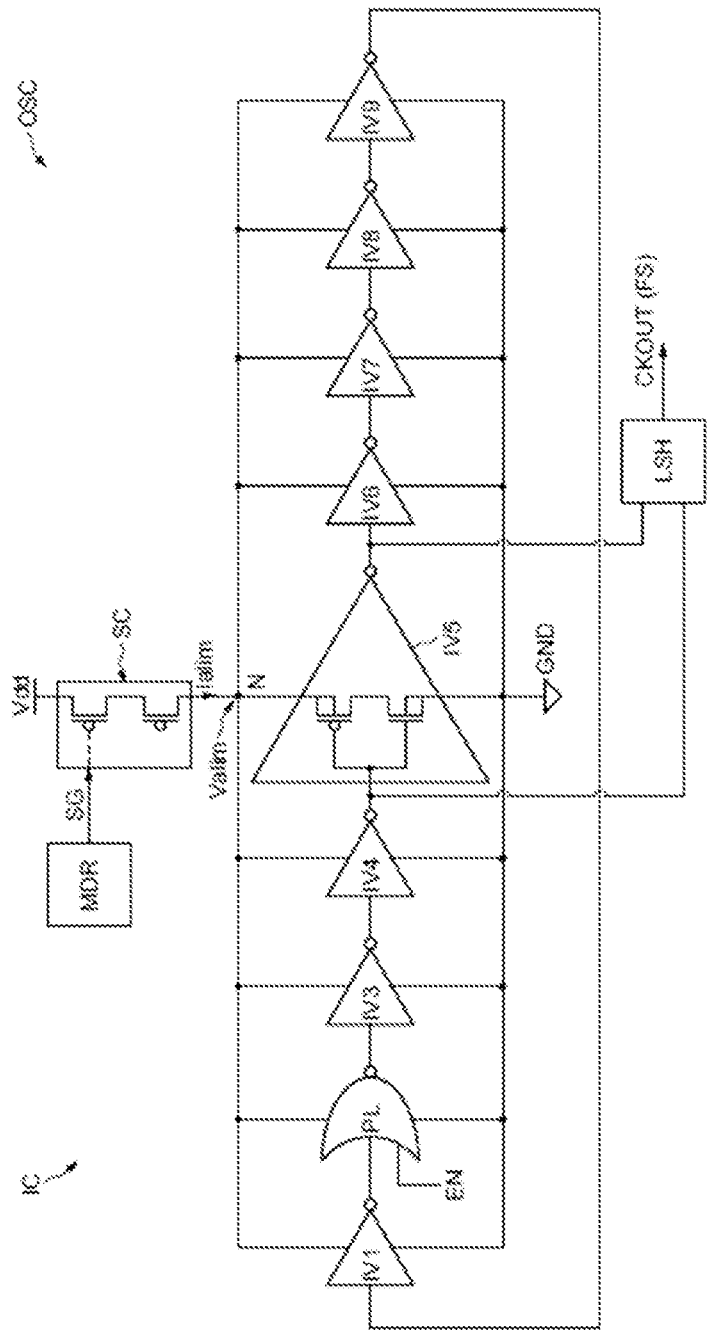
[Fig 1]

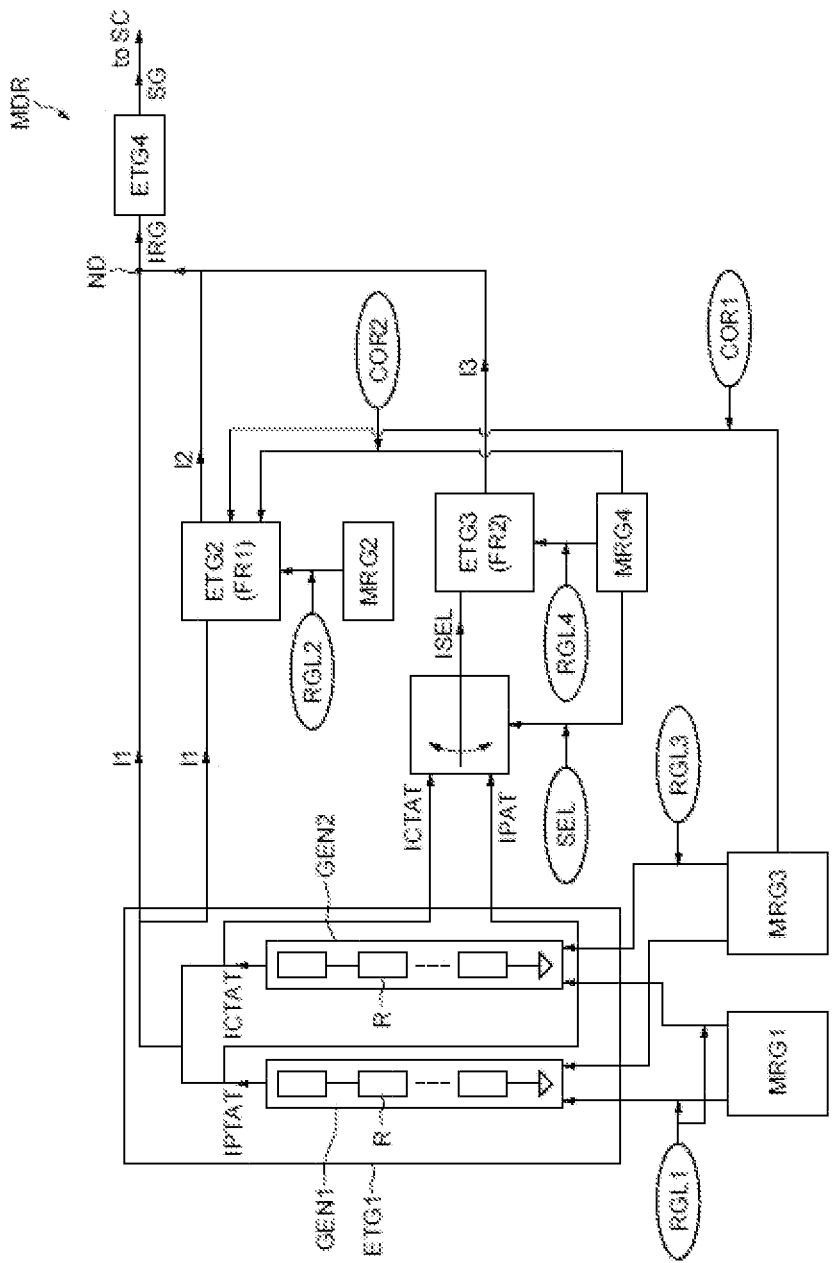

[Fig 3]
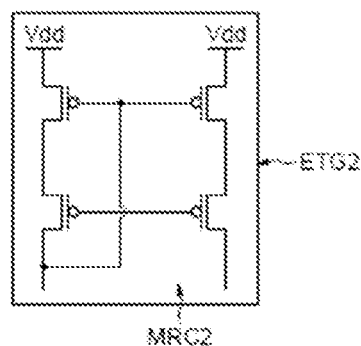
[Fig 4]
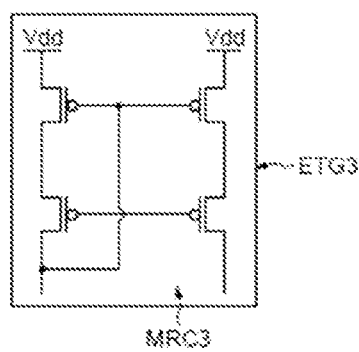
[Fig 5]
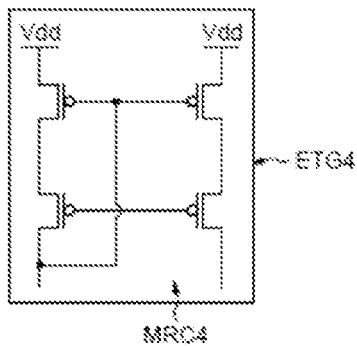

[Fig 6]
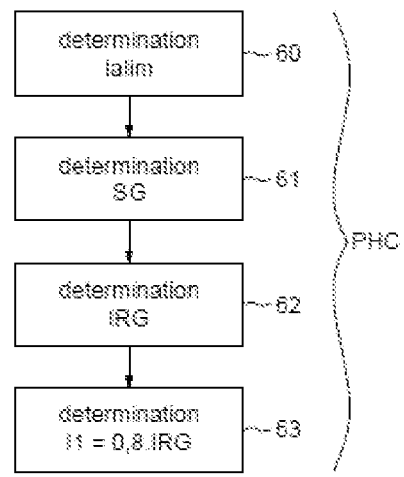
[Fig 7]
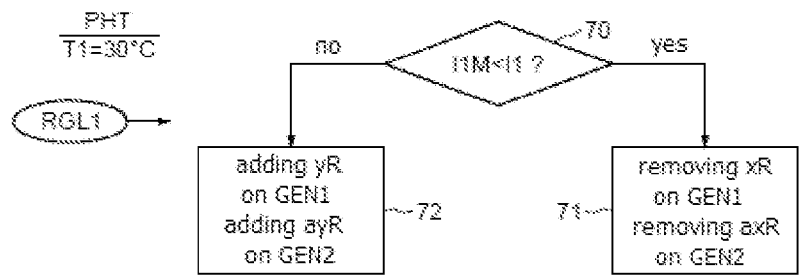
[Fig 8]
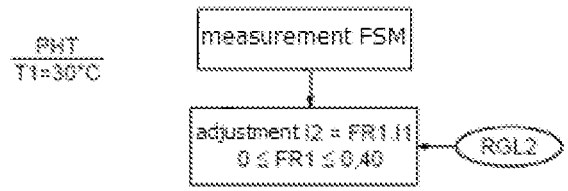

[Fig 9]
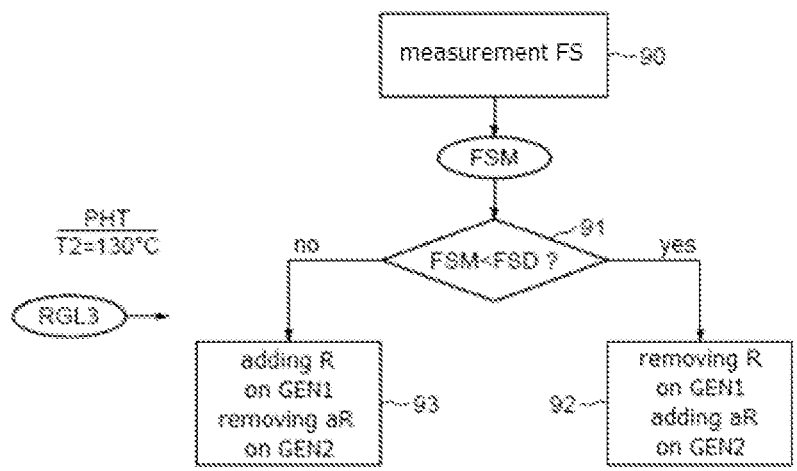
[Fig 10]
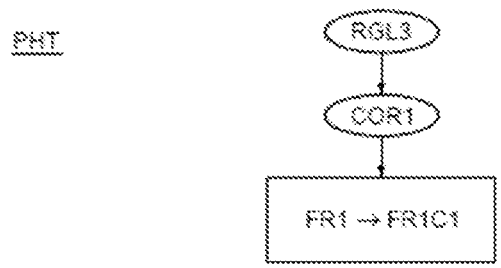

[Fig 11]
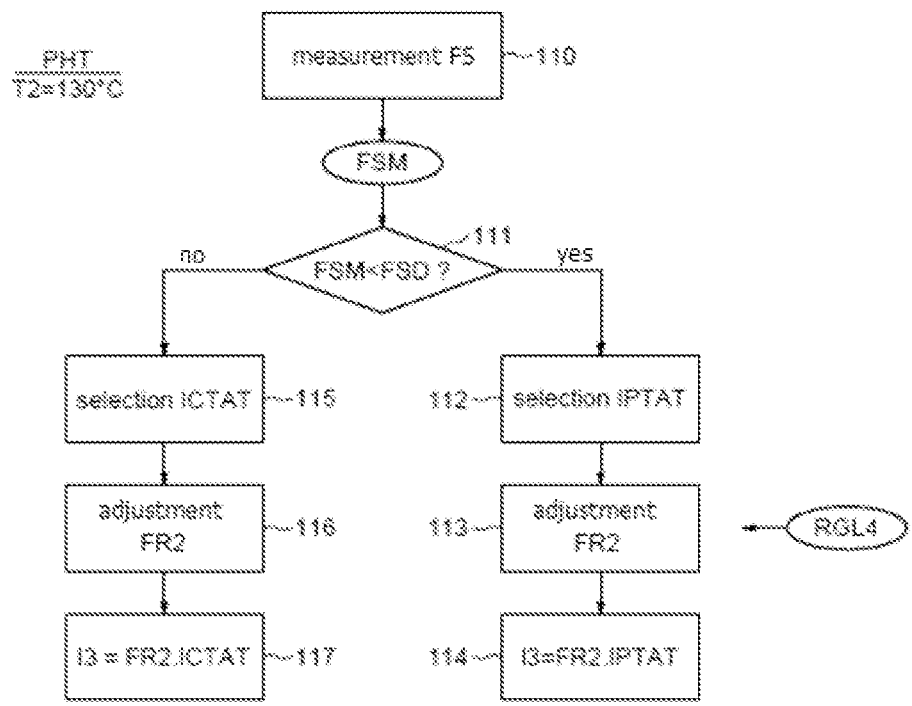
[Fig 12]
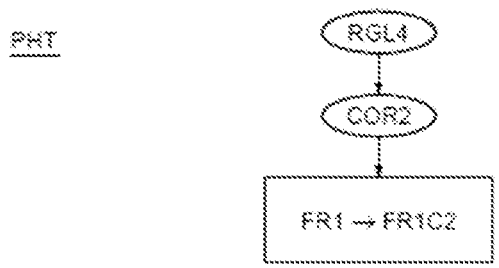

[Fig 13]
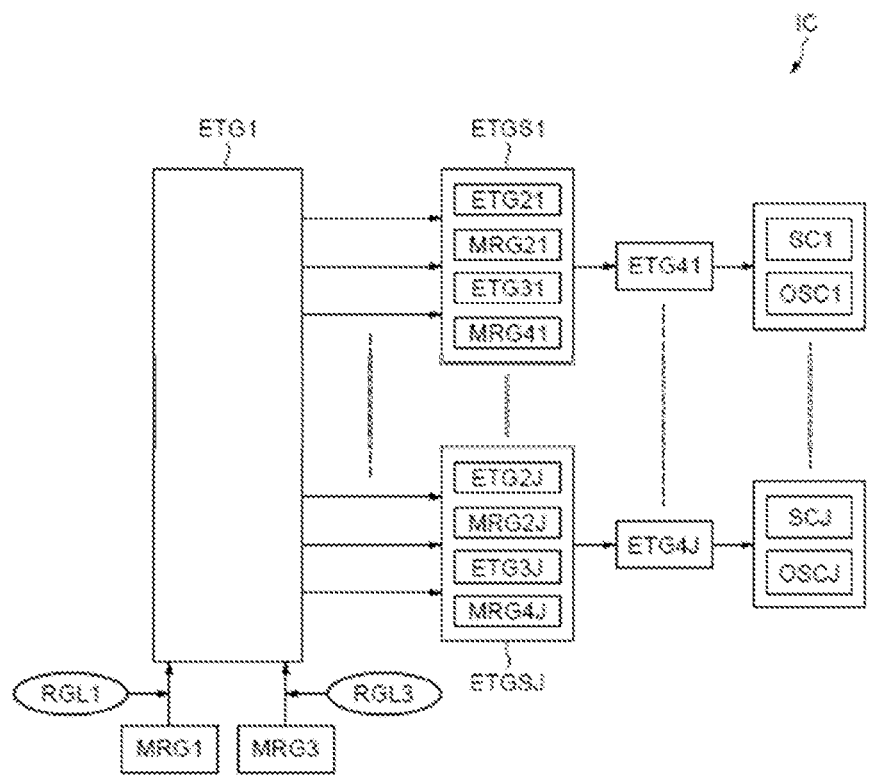

INTEGRATED CIRCUIT COMPRISING AT LEAST ONE RING OSCILLATOR AND METHOD FOR CONTROLLING AN OPERATION OF THE OSCILLATOR

CROSS-REFERENCE TO RELATED APPLICATIONS

This application claims the benefit of French Application No. 2000011, filed on Jan. 2, 2020, which application is hereby incorporated herein by reference.

TECHNICAL FIELD

Embodiments of the invention relate to integrated circuits, and more particularly those including one or more ring oscillators, and controlling the operation of such oscillators.

BACKGROUND

Oscillators are generally used within an integrated circuit, for example within a microcontroller, to provide output signals such as clock signals.

These clock signals can have different frequency values.

It is particularly advantageous that the frequency of the output signal provided by the oscillator is sufficiently accurate regardless of the technological variations of the method used for the manufacture of the oscillator and regardless of the voltage and temperature conditions. Typically, it is desirable to have an accuracy of + or −1% on the output frequency.

At the same time, it is desirable to have an oscillator that does not consume too much current.

Oscillators having capacitive resistive structures are known.

Such oscillators prove to be very accurate but have a high consumption, typically greater than 2 microamps per MHz.

Moreover, oscillators having a ring structure, that is to say having an odd number of inverters looped back to form the ring, are also known.

Such oscillators can have low consumption but at the expense of their accuracy.

There is therefore a need to provide an oscillator which offers both low consumption with good accuracy (typically of the order of + or −1%) on the output frequency, regardless, in particular, of the voltage and temperature conditions.

SUMMARY

According to one aspect, an integrated circuit is thus proposed, comprising at least one ring oscillator including a succession of inverters looped back to form the ring, the at least one oscillator being intended to operate at a desired output frequency and configured so that the inverter transistors operate in or near their temperature inversion zone.

Operating the transistors in or near their temperature inversion zone allows limiting variations in the transition duration of the inverters depending on the temperature.

It is recalled that the transition duration or switching duration is the duration necessary for the inverter to move from a first logic state to a second logic state.

The temperature inversion zone of a transistor is a feature known to a person skilled in the art.

More specifically, the temperature inversion relates to the phenomenon according to which, for some voltage ranges, the transistor operates faster at high temperature.

More specifically, when the temperature increases, the performance of the transistor is affected by two factors, namely a decrease in the mobility of the carriers and a reduction in the threshold voltage.

A decrease in the mobility of the carriers leads the transistor to operate more slowly while a reduction in the threshold voltage causes the opposite effect, that is to say leads the transistor to operate faster.

And, the temperature inversion occurs in an area where the power voltage of the transistor is low enough to make the second factor (that is to say the reduction of the threshold voltage) dominant under heat.

Thus, an operation of the transistors in or near the temperature inversion zone allows limiting the consumption of the oscillator since the operating voltage is low.

Also, with the combination of a ring structure and an operation of the oscillator inverter transistors in or near the temperature inversion zone, an oscillator offering improved accuracy with a reduced current consumption is obtained.

Thus, according to one embodiment, the integrated circuit further comprises current generation means, for example including a current source, configured to provide a power current (or bias current) to the inverters of the at least one oscillator allowing each inverter to be powered with a current bringing a power voltage (or bias voltage) compatible with the operation of the transistors of the inverter in or near their temperature inversion zone.

A person skilled in the art will be able to adjust this power current so as to operate the inverter transistors in or near their temperature inversion zone.

Nevertheless, as an indication, the current generation means are configured to provide a power current allowing to power each inverter of the at least one oscillator with a power voltage greater than the threshold voltage of the inverter and less than 1.6 times the threshold voltage.

The threshold voltage of an inverter is generally greater than or equal to the largest of the threshold voltages of the PMOS transistor and the NMOS transistor of the inverter.

This threshold voltage can therefore be of the order of 0.7 volts, for example at 30° C.

When the current generation means include a current source, it is particularly advantageous, so as to limit the sensitivity of the power or bias voltage of the transistors of the inverter to possible fluctuations of the general power voltage of the integrated circuit, that the current source advantageously includes cascode transistors.

According to one embodiment, the current generation means include a command input, typically the gate of a PMOS transistor, intended to receive a command signal, for example a gate voltage, in the presence of which they are configured to provide the power current to each inverter of the oscillator, typically on the drain of the PMOS transistor of each inverter.

In order to further improve the accuracy of the output frequency of the oscillator, it is advantageously provided to carry out adjustments of the command signal and therefore of the power or the bias current of the inverters, at least at one first temperature and preferably at several, for example two, different temperatures.

Thus, the command signal can be produced from at least one first measurement of the output frequency of the oscillator carried out at a first temperature, for example 30° C., and of the output frequency desired for the oscillator, for example 48 MHz.

To further improve the accuracy, the command signal can be produced on the basis of a second measurement of the output frequency of the oscillator, carried out at a second temperature, for example 130° C., different from the first temperature, and of the output frequency desired for this oscillator.

Two temperatures are said to be different from each other when they allow covering a substantial range of possible operating temperatures. A person skilled in the art will be able to adjust the choice of these temperatures depending on the intended application.

As an indication, the second temperature can be different from the first temperature by several tens of degrees Celsius.

The second temperature can be lower or higher than the first temperature.

These adjustments are advantageously performed during an integrated circuit test phase and they can for example then be frozen in a memory of the integrated circuit.

Alternatively, they can also be performed during the operation of the integrated circuit using another more accurate reference clock source (for example a quartz).

Thus, according to one embodiment, the integrated circuit further comprises an adjustment module having an output directly or indirectly connected to the command input and configured to produce the command signal on the basis of
at least one first measurement of the output frequency of the at least one oscillator carried out at a first temperature, and
the output frequency desired for the at least one oscillator.

Different embodiments relating to this adjustment module are possible and are now stated in general.

According to one embodiment, the adjustment module is configured to produce the command signal from an adjustment current equal to the sum of at least
one first intermediate current taken from the sum of an adjustable current proportional to the absolute temperature and an adjustable current inversely proportional to the absolute temperature, and
one second intermediate current equal to a first adjustable fraction of the first intermediate current.

According to one embodiment, the adjustment module comprises
a first stage including a first adjustable generator configured to generate the adjustable current proportional to the absolute temperature and a second adjustable generator configured to generate the adjustable current inversely proportional to the absolute temperature,
a second adjustable stage coupled to the first stage and configured to produce the second intermediate current,
first adjustment means coupled to the first generator and to the second generator, and configured to carry out a first adjustment of the current proportional to the absolute temperature and a first adjustment of the current inversely proportional to the absolute temperature, (these first adjustments including for example resistor adjustments),
second adjustment means coupled to the second stage and configured to carry out a second adjustment of the first fraction,
the first adjustment being carried out on the basis of a measurement of the first intermediate current carried out at the first temperature and of a desired current, or else on the basis of the first measurement of the output frequency of the at least one oscillator carried out at the first temperature and of the desired output frequency,
the second adjustment being carried out on the basis of the first measurement of the output frequency of the at least one oscillator carried out at the first temperature and of the desired output frequency.

According to one embodiment, the second stage includes a first cascode current mirror device having an adjustable division ratio.

According to one embodiment, the adjustment module is further configured to produce the command signal on the basis of
a second measurement of the output frequency of the at least one oscillator, carried out at a second temperature different from the first temperature, and
the output frequency desired for the at least one oscillator.

According to one embodiment, the adjustment module comprises
third adjustment means, coupled to the first generator and to the second generator, and configured to carry out a third adjustment of the current proportional to the absolute temperature and a third adjustment of the current inversely proportional to the absolute temperature on the basis of the second measurement of the output frequency carried out at the second temperature, and of the desired output frequency,
the third adjustment means being configured to carry out these two third adjustments (for example also including resistor adjustments) in a complementary manner.

According to one embodiment, the third adjustment means can also be coupled to the second stage and are configured to correct the value of the first fraction according to the two third adjustments.

According to one embodiment, the adjustment module is configured to produce the command signal from the adjustment signal equal not only to the sum of the first intermediate current and the second intermediate current but also of a third intermediate current equal to a second adjustable fraction of the current proportional to the absolute temperature or of the current inversely proportional to the absolute temperature.

According to one embodiment, the adjustment module comprises
a third adjustable stage, coupled to the first generator and to the second generator, and configured to produce the third intermediate current, and
fourth adjustment means, coupled to the first generator, to the second generator and to the third stage, and configured to carry out, on the basis of a measurement of the output frequency of the at least one oscillator at the second temperature and of the desired output frequency,
on the one hand, the selection between the current proportional to the absolute temperature and the current inversely proportional to the absolute temperature, and
on the other hand, a fourth adjustment of the value of the second fraction of the selected current.

According to one embodiment, the third stage includes a second cascode current mirror device having an adjustable division ratio.

According to one embodiment, the fourth adjustment means are also coupled to the second stage and are configured to correct the value of the first fraction taking into account the adjusted value of the second fraction.

According to one embodiment, the adjustment module may further comprise a fourth stage configured to receive the adjustment signal and to provide the command signal.

The second, third and fourth stages are not essential when the integrated circuit comprises only one oscillator, but they can be particularly advantageous when the integrated circuit comprises several oscillators with adjustment means in common.

Similarly, the first and third adjustment means are not essential when the integrated circuit comprises the second and third stages with the second and fourth associated adjustment means.

In other words, it is possible to set the value of the currents proportional and inversely proportional to the absolute temperature, to dispense with regulating these currents and to compensate for this absence of adjustments by suitable second and fourth adjustments.

According to one embodiment, the fourth stage comprises a third cascode current mirror device.

As indicated above and according to one embodiment, it is moreover of course considered that the integrated circuit may comprise several ring oscillators intended to operate each at different desired output frequencies, each ring oscillator then being configured so that the transistors of the inverters of this oscillator operate in or near their temperature inversion zone.

According to one embodiment, the integrated circuit comprises an adjustment module and current generation means, for example a current source, assigned to each ring oscillator.

Nevertheless, it is particularly advantageous that the first stage and the first and third adjustment means are common to all the oscillators, the other stages and adjustment means then being specific to each oscillator.

According to another aspect, a control method is proposed, comprising controlling the operation of at least one ring oscillator, the at least one oscillator including a succession of inverters looped back to form the ring.

In the method according to this aspect, the transistors of the inverters are operated in or near their temperature inversion zone.

According to one embodiment, the method comprises providing a power current to the inverters of the at least one oscillator so as to power each inverter with a power voltage compatible with an operation of the transistors of the inverter in or near their temperature inversion zone.

According to one embodiment, the method comprises providing a power current allowing to power each inverter of the at least one oscillator with a power voltage greater than the threshold voltage of the inverter and less than 1.6 times the threshold voltage.

According to one embodiment, the method comprises providing the power current by current generation means, for example a current source, commanded by a command signal, and producing the command signal on the basis of
at least one first measurement of the output frequency of the oscillator carried out at a first temperature, and
an output frequency desired for the oscillator.

According to one embodiment, the method comprises producing the command signal from an adjustment current equal to the sum of at least
one first intermediate current taken from the sum of an adjustable current proportional to the absolute temperature and an adjustable current inversely proportional to the absolute temperature, and
one second intermediate current equal to a first adjustable fraction of the first intermediate current.

According to one embodiment, the method comprises
a first adjustment of the current proportional to the absolute temperature, and a first adjustment of the current inversely proportional to the absolute temperature,
a second adjustment of the first fraction,
the first adjustment being carried out on the basis of a measurement of the first intermediate current carried out at the first temperature and of a desired current, or else on the basis of the first measurement of the output frequency of the at least one oscillator carried out at the first temperature and of the desired output frequency,
the second adjustment being carried out on the basis of the first measurement of the output frequency of the at least one oscillator carried out at the first temperature and of the desired output frequency.

According to one embodiment, the method comprises producing the command signal on the basis of a second measurement of the output frequency of the oscillator, carried out at a second temperature different from the first temperature, and of the output frequency desired for the oscillator.

According to one embodiment, the method comprises
a third adjustment of the current proportional to the absolute temperature and a third adjustment of the current inversely proportional to the absolute temperature on the basis of the second measurement of the output frequency carried out at the second temperature and of the desired output frequency,
these two third adjustments being carried out in a complementary manner.

According to one embodiment, the method comprises correcting the value of the first fraction according to the two third adjustments.

According to one embodiment, the method comprises producing the command signal from the adjustment signal equal to the sum of the first intermediate current, the second intermediate current and a third intermediate current equal to a second adjustable fraction of the current proportional to the absolute temperature or of the current inversely proportional to the absolute temperature.

According to one embodiment, the method comprises, on the basis of a measurement of the output frequency of the at least one oscillator at the second temperature and of the desired output frequency,
on the one hand, a selection between the current proportional to the absolute temperature and the current inversely proportional to the absolute temperature, and
on the other hand, a fourth adjustment of the value of the second fraction of the selected current.

According to one embodiment, the method comprises correcting the value of the first fraction taking into account the adjusted value of the second fraction.

Although the above-mentioned adjustments may be specific to each oscillator when controlling the operation of several oscillators is provided, it is particularly advantageous when controlling the operation of several oscillators that some adjustments are common to all the oscillators and that other adjustments are specific to each oscillator.

Thus, according to one embodiment, the first adjustment of the current proportional to the absolute temperature and the first adjustment of the current inversely proportional to the absolute temperature can be common to all the oscillators, while the second adjustment of the first fraction is specific to each oscillator.

Thus, the first adjustment is carried out for example on the basis of the first measurement of the output frequency of one of the oscillators carried out at the first temperature and of the desired output frequency of this oscillator.

The second adjustments are carried out for example on the basis of the first measurement of the respective output frequencies of the oscillators carried out at the first temperature and of the respective desired output frequencies.

The third adjustment of the current proportional to the absolute temperature and the third adjustment of the current inversely proportional to the absolute temperature may also be advantageously common to all the oscillators and may be implemented on the basis of the second measurement of the output frequency of one of the oscillators carried out at the second temperature and of the desired output frequency of this oscillator.

However, according to one embodiment, the method comprises, on the basis of a measurement of the output frequency of each oscillator at the second temperature and of the output frequency desired for the considered oscillator,
- on the one hand, a selection for the considered oscillator, between the current proportional to the absolute temperature and the current inversely proportional to the absolute temperature, and
- on the other hand, a fourth adjustment of the value of the second fraction of the current selected for the considered oscillator.

According to one embodiment, the method comprises correcting the value of the first fraction for a considered oscillator taking into account the adjusted value of the second fraction for this oscillator.

According to one embodiment, the method comprises, the at least one ring oscillator being incorporated within an integrated circuit, implementing the various adjustments during a test phase of the integrated circuit.

BRIEF DESCRIPTION OF THE DRAWINGS

Other advantages and features of the invention will appear upon examining the detailed description of non-limiting embodiments and the appended drawings wherein:

FIG. 1 illustrates an integrated circuit including a ring oscillator;

FIG. 2 illustrates an adjustment module;

FIG. 3 illustrates a second stage including a cascode current mirror device;

FIG. 4 illustrates a third stage including a cascode current mirror device;

FIG. 5 illustrates a fourth stage including a cascode current mirror device;

FIG. 6 illustrates a design phase for the oscillator and the integrated circuit;

FIGS. 7-12 illustrate a test phase for the integrated circuit; and

FIG. 13 illustrates an embodiment integrated circuit including several oscillators.

DETAILED DESCRIPTION OF ILLUSTRATIVE EMBODIMENTS

In FIG. 1, the reference IC designates an integrated circuit including in this example a ring oscillator OSC.

As is well known to a person skilled in the art, this type of oscillator is based on the duration of switching an inverter. By connecting an odd number of inverters, a naturally oscillating signal is obtained at the output of each inverter of the chain.

The frequency FS of the oscillator output signal CKOUT is directly related to the number of inverters.

In this example, the oscillator is a nine-stage oscillator, one of the inverters of which is replaced by a NOR logic gate, referenced PL, which allows turning off or turning on the oscillator by means of the control signal EN.

The eight inverters IV1 and IV3 to IV9, as well as the logic gate PL are looped back to form the ring and they are all powered via a common power node N by a voltage Valim.

The other power terminal of the inverters and of the logic gate PL is connected to the ground GND.

As is conventional, each inverter includes a PMOS transistor whose source and well are connected to the node N and an NMOS inverter whose source and substrate are connected to the ground GND.

The oscillator OSC also includes a shaping circuit, for example a level shifter LSH, of conventional and known structure, and connected between the input and the output of one of the inverters of the oscillator OSC.

It is this circuit LSH which provides the output signal CKOUT of the oscillator having the output frequency FS.

The integrated circuit also here includes a current source SC, configured to provide a power or bias current Ialim to the node N so as to power each inverter with the power or bias voltage Valim.

This power voltage is compatible with the operation of the transistors of each inverter in or near their temperature inversion zone.

Typically, this power voltage Valim is greater than the threshold voltage of the inverter and less than 1.6 times the threshold voltage.

The threshold voltage of the inverter is generally equal to or slightly higher than the largest of the threshold voltages of the PMOS transistor and the NMOS transistor of an inverter.

In this example, the threshold voltage of the inverter is around 0.7 volts at 30° C.

The voltage Valim is then equal to about 1.1 volts.

In the example described here, the width W of a PMOS transistor of an inverter is of the order of 400 nanometers while the length of the PMOS transistor is of the order of 560 nanometers.

The length of the NMOS transistor of the inverter is then about 1.5 times the length of the PMOS transistor.

The oscillator OSC, with its nine inverters, here has an output frequency equal to 48 MHz and the current Ialim is equal to 2.4 microamps at 30° C.

In this example, the current source SC is advantageously a cascode current source, which allows making the current Ialim almost insensitive to variations in the power voltage Vdd of the integrated circuit.

The current source SC includes a command input, typically the gate of a PMOS transistor, intended to receive a command signal SG in the presence of which it is configured to provide the power current Ialim.

This command signal SG which consequently imposes a source gate voltage on the PMOS transistor of the current source SC is provided by an adjustment module MDR which will be discussed in more detail below on the structure.

However, it can already be indicated that this adjustment module MDR is configured to produce the command signal SG on the basis of
- at least one first measurement of the output frequency of the oscillator, a measurement carried out at a first temperature, (for example 30° C.), and
- the output frequency, for example 48 MHz, desired for this oscillator OSC.

Reference is now made more particularly to FIG. 2, which schematically illustrates an exemplary embodiment of the adjustment module MDR.

In a general and basic manner, the adjustment module MDR is configured to produce the command signal SG from an adjustment current IRG which is equal to the sum of at least one first intermediate current I1 and one second intermediate current I2 in turn equal to a first adjustable fraction FR1 of the first intermediate current I1.

These two currents I1 and I2 are summed at the node Nd.

The command signal SG is provided in this example by a stage ETG4 including a current mirror device receiving as input the adjustment signal IRG.

In this example, the current mirror device of the stage ETG4 has a multiplying factor equal to 4.

This stage ETG4 is not essential when the integrated circuit includes only one oscillator. Its presence is however preferable, when the integrated circuit includes several oscillators, as will be seen in more detail below.

Nonetheless, in this exemplary embodiment which includes only one oscillator, this stage ETG4 is present.

Taking into account that the current Ialim necessary to power the inverters of the oscillator is taken to be equal, in this example, to 2.4 microamps at 30° C. and that there is a multiplier ratio of 4 for the current mirror device ETG4, the adjustment current IRG is therefore equal to 600 nanoamps at 30° C.

The first intermediate current I1 is taken from the sum of an adjustable current IPTAT proportional to the absolute temperature and an adjustable current ICTAT inversely proportional to the absolute temperature.

As will be seen in more detail below, it will be advantageous to choose a first intermediate current I1 equal for example to 80% of the adjustment current IRG so as to be able to add to this current I1, the second intermediate current I2 which may be equal for example to 0% of I1, to 20% of I1 or to 40% of I1 depending on the typical, slow or fast nature of the oscillator.

The adjustment module MDR moreover includes a first stage ETG1.

This first stage ETG1 comprises a first adjustable generator GEN1 configured to generate the adjustable current IPTAT proportional to the absolute temperature, and a second adjustable generator GEN2 configured to generate the adjustable current ICTAT inversely proportional to the absolute temperature.

The structure of such generators GEN1 and GEN2 is conventional and well known to a person skilled in the art.

The first generator GEN1 includes z resistors and the second generator GEN2 includes a.z resistors with more or less a few resistors.

The adjustment of the current IPTAT in the generator GEN1 is obtained by adding or removing a certain number x of resistors R while the adjustment of the current ICTAT is obtained in the generator GEN2 by removing or adding a certain number a.y of resistors in the generator GEN2, The adjustment module MDR moreover includes a second adjustable stage ETG2 coupled to the first stage ETG1 and configured to produce the second intermediate current I2 on the basis of the first intermediate current I1.

The adjustment module moreover comprises first adjustment means MRG1 coupled to the first generator GEN1, and to the second generator GEN2 and configured to carry out a first adjustment RGL1 of the current proportional to the absolute temperature IPTAT as well as a first adjustment RGL1 of the current inversely proportional to the absolute temperature ICTAT.

In this example the two adjustments RGL1 are identical (x=y). In other words, the adjustment of the current IPTAT in the generator GEN1 is obtained by adding or removing a certain number x of resistors R while the adjustment of the current ICTAT is obtained in the generator GEN2 by removing or adding a certain number a.x of resistors in the generator GEN2.

The adjustment module MDR moreover includes second adjustment means MRG2 coupled to the second stage ETG2 and configured to perform a second adjustment RGL2 of the first fraction FR1 allowing to obtain the second intermediate current I2 on the basis of the first intermediate current I1.

These two adjustments RGL1 and RGL2 will be detailed in more detail below, but it can already be said that they are carried out on the basis of
 the first measurement of the oscillator output frequency carried out at the first temperature T1, for example 30°, and
 the output frequency desired for the oscillator, for example here 48 MHz.

In order to further improve the adjustment accuracy, the adjustment module MDR is further configured to produce the command signal SG, and therefore the adjustment signal IRG, on the basis of
 a second measurement of the frequency of the oscillator, carried out this time at a second temperature T2, different from the first temperature T1, for example at 130° C., and
 the frequency desired for the oscillator.

In this regard, the adjustment module comprises third adjustment means MRG3, coupled to the first generator GEN1 and to the second generator GEN2 and configured to carry out a third adjustment RGL3 of the current IPTAT proportional to the absolute temperature and a third adjustment of the current ICTAT inversely proportional to the absolute temperature, on the basis of the second measurement of the frequency at the second temperature and of the desired output frequency.

However, as will be seen in more detail below, these third adjustment means MRG3 are configured to carry out these third adjustments in a complementary manner at the currents IPTAT and ICTAT.

In order to further improve the adjustment accuracy, it is advantageous that the third adjustment means MRG3 are also coupled to the second stage ETG2 and are configured to carry out a correction COR1 of the value of the first fraction according to the two third complementary adjustments RGL3. Again, the third adjustments RGL3 and the correction COR1 will be detailed in more detail below.

In order to further improve the adjustment accuracy, the adjustment module MDR is preferably configured to produce the command signal SG from the adjustment signal IRG equal not only to the sum of the first intermediate current I1, of the second intermediate current I2 but also of a third intermediate current I3 equal to a second adjustable fraction FR2 of the current IPTAT proportional to the absolute temperature or of the current ICTAT inversely proportional to the absolute temperature.

In this regard, the adjustment module MDR comprises a third adjustable stage ETG3, coupled to the first generator GEN1 and to the second generator GEN2 and configured to produce the third intermediate current I3.

The adjustment module MDR also comprises fourth adjustment means MRG4, coupled to the first generator GEN1, to the first generator GEN2 and to the third stage ETG3 and configured to carry out, on the basis of a measurement of the output frequency of the oscillator at the second temperature T2 (130° C. for example) and of the desired output frequency (48 MHz for example),
 on the one hand, the selection SEL between the current IPTAT proportional to the absolute temperature and the current ICTAT inversely proportional to the absolute temperature, and
 on the other hand, a fourth adjustment RGL4 of the value of the second fraction FR2 of the selected current ISEL.

The fourth adjustment means MRG4 are also coupled to the second stage ETG2 and are configured to advantageously carry out a correction COR2 of the value of the first fraction FR1 taking into account the corrected value of the second fraction FR2.

Again, this fourth adjustment RGL4 and this correction COR2 will be detailed in more detail below.

As schematically illustrated in FIGS. 3 to 5, each of the stages ETG2, ETG3 and ETG4 includes a preferentially cascode current mirror device MRC2, MRC3 and MRC4 so as to overcome possible variations in the power voltage Vdd of the integrated circuit.

The division or multiplication ratios of these stages are made in a manner which is conventional and known per se, for example by the number of transistors used, and commandable, in a manner which is conventional and known per se, for example by means of switches.

The different adjustment means MRG1-MRG4 may for example include logic circuits.

Reference is now made more particularly to FIGS. 6 to 12 to describe an embodiment of a method for controlling the operation of the oscillator OSC.

As illustrated in FIG. 6, in a phase PHC of designing the oscillator and the integrated circuit, the current Ialim (step 60) necessary to power the inverters of the oscillator and have a voltage Valim allowing operation of the inverter transistors in or near the temperature inversion zone, is determined, for example by simulation.

In the example described above, Ialim is equal to 2.4 microamps at 30° C. for an oscillator with 9 inverters having a desired output frequency of 48 MHz.

Then, the value of the command signal SG (typically the source gate voltage of the PMOS transistor of the current source and the corresponding drain-source current, or vice versa, as well as the associated cascode voltage) is determined (step 61) then, the value of the adjustment current IRG (step 62) is determined, taking into account the presence of the stage ETG4.

It is recalled here that in the example described above, taking into account the multiplier ratio of 4 of the stage ETG4, the current IRG is determined to be equal to 600 nanoamps at 30° C.

Then, the value desired for the first intermediate current I1 which is selected to be approximately equal to 80% of the adjustment current IRG, is deduced (step 63), that is in this example 540 nanoamps at 30° C.

Then, as illustrated in FIG. 7 and following, a test phase PHT of the integrated circuit is carried out.

As regards the first adjustment RGL1, the integrated circuit is placed in a chamber at 30° C. and the first intermediate current I1M is measured.

This measured current IM is compared with the desired theoretical current I1 determined in the design phase PHC step 63.

If the measured current I1M is lower than the current I1 then current IPTAT and current ICTAT must be added.

This is what is done in step 71 by removing x resistors R on the generator GEN1 and correspondingly removing a.x resistors R on the generator GEN2.

If on the other hand the measured current I1M is greater than the current I1, then it is necessary to remove the current IPTAT and the current ICTAT.

This is what is done in step 72 by adding for example y resistors R on the generator GEN1 and by correlatively adding a.y resistors R on the generator GEN2.

Still in the test phase PHT and still at the first temperature T1=30°, the second adjustment RGL2 of the first fraction FR1 (FIG. 8) is performed.

In this regard, the output frequency of the oscillator OSC is measured.

This measured output frequency is referenced FSM.

If this measured output frequency FSM is of the order of the output frequency desired for the oscillator (for example 48 MHz), then this means that a typical oscillator is present and in this case the first fraction FR1 is adjusted at the value 0.2 so as to add to the first current I1, 20% of the current IRG and obtain 100% of the current IRG.

If on the other hand the measured frequency FSM is less than the desired output frequency, then this means that a slow oscillator is present, and in this case the first fraction FR1 can be increased up to the value 0.40 if necessary so as to add the current I2 to the current I1 and obtain a measured frequency of the order of the output frequency desired for the oscillator (for example 48 MHz), namely a current IRG equal to up to 120% of the current I1.

If, on the other hand, the measured frequency FSM is greater than the desired output frequency, this means that a fast oscillator is present. And in this case, the fraction FR1 can be reduced until cancelled if necessary so as to add to the first current I1 only a low current I2, or even no current I2, and obtain a measured frequency of the order of the output frequency desired for the oscillator (for example 48 MHz). The current IRG will then be equal to only 80% of the current I1.

A person skilled in the art will be able to adjust the fraction FR1 at any suitable value, for example comprised between 0 and 0.4.

FIG. 9 illustrates an example of the third adjustment RGL3.

In this regard, still in the test phase PHT, the integrated circuit is placed in a chamber this time adjusted to a second temperature T2, different from the first temperature, for example at 130° C.

Here again, in step 90, the output frequency of the oscillator is measured so as to obtain the measured value FSM.

If in step 91, the value FSM is less than the desired frequency FSD, then in step 92, one or more resistors R are removed on the generator GEN1 and complementarily, a times the number of resistors removed on GEN1 are added on GEN2.

However, if the measured value FSM is greater than the desired value FSD, then in step 93, this time one or more resistors are added on the generator GEN1 and complementarily, a times the number of resistors added on the generator GEN1 are removed on the generator GEN2.

If the second temperature was less than the first one (−40° C. for example):
  one or more resistors R would be removed on the generator GEN1 and, complementarily, the number of resistors removed on GEN1 would be added on GEN2, if FSM was greater than FSD, and
  one or more resistors R would be added on the generator GEN1 and, complementarily, a times the number of resistors added on GEN1 would be removed on GEN2, if FSM was less than FSD.

This minimises the impact of this treatment RGL3 on the adjustments made at 30° C.

In order to further minimise this impact, it is possible, as explained above, to carry out a correction COR1 of the first fraction FR1 so as to obtain, as illustrated in FIG. 10, a first corrected fraction FR1C1 so that the frequency at 30° C. is always of the order of the desired frequency.

For example, if during the third adjustment RGL3, the resistor values had been corrected with one or more adjustment pitches, the first fraction FR1 will be modified taking into account each of these adjustment pitches. The value of this correction can be obtained by simulation.

A person skilled in the art will be able to adjust the first fraction FR1 depending on the third adjustment RGL3 so as to obtain the frequency at 30° C. of the order of the desired frequency.

Typically, the adjustment of the division and/or multiplication coefficients of the different stages ETG2 and ETG3 can be carried out by adjustment or correction pitches by means of thermometric decoding and commandable switches.

FIG. 11 schematically illustrates the selection of the current ICTAT of the current IPTAT and the fourth adjustment RGL4 of the second fraction FR2 allowing to obtain the third intermediate current I3.

Again, this is carried out during the test phase PHT at the second temperature T2 of 130° C.

In step 110, the output frequency of the oscillator is measured so as to obtain the measured frequency FSM.

If this measured frequency FSM is in step 111 less than the desired output frequency FSD, then this means that the current IPTAT should be added.

The current IPTAT is therefore selected in step 112 and the adjustment RGL4 will be performed in step 113.

More particularly, the current IPTAT will be added, for example by increasing the value of the second fraction FR2 by one or more adjustment pitches.

The current I3 is then in step 114 equal to the product of the current IPTAT by this second fraction FR2 thus adjusted.

However, if in step 111 the measured value FSM is less than the desired value FSD, then the current ICTAT is selected in step 115 and the second fraction FR2 is adjusted in step 116 in a manner similar to what was described in step 113 so as to obtain an adjusted fraction FR2.

The third intermediate current I3 is then equal in step 117 to the product of the current ICTAT by this second fraction FR2 thus adjusted.

If the second temperature was less than the first one (−40° C. for example) step 112 would select the current ICTAT and step 115 the current IPTAT.

In order to minimise or even reduce the impact of this adjustment carried out at 130 degrees, on the adjustments of the stage ETG2 carried out at 30 degrees, a new correction COR2 of the first fraction FR1 can be performed, as in FIG. 12, so as to obtain in step 120 a new first corrected fraction FR1C2 so that the frequency at 30° C. is always of the order of the desired frequency.

This correction COR2 is carried out according to the value of the adjustment RGL4.

Thus, if the fraction FR2 is increased by one adjustment pitch, then the first fraction FR1 will also be decreased by one adjustment pitch or by one adjustment pitch ratio.

With the embodiments which have just been described, it is possible to obtain an oscillator providing an output frequency with an accuracy of the order of + or −1% with a low consumption of the oscillator equal to 2.4 microamps at 30° C. for a frequency of 48 MHz for example, or 50 nA per MHZ.

Reference is now made more particularly to FIG. 13 which illustrates an embodiment wherein the integrated circuit CI includes several oscillators, here J oscillators OSC1-OSCJ respectively associated with J current sources SC1-SCJ.

In such an embodiment, it is particularly advantageous that the first stage ETG1 as well as the first adjustment means MRG1 and the third adjustment means MRG3 are common to all the oscillators.

However, there is a specific stage ETGSJ associated with the oscillator OSCJ;

The specific stages ETGS1-ETGSJ respectively include the second stages ETG21-ETG2J, the second adjustment means MRG21-MRG2J, the third stages ETG31-ETG3J and the fourth adjustment means MRG41-MRG4J.

Moreover, the fourth stages ETG41-ETG4J are also specific respectively to the J oscillators OSC1-OSCJ.

Indeed, it appears that the first and third adjustment means MRG1 and MRG3 which influence the number of resistors of the generators GEN1 and GEN2 implement adjustments which are identical at first approximation for all the oscillators.

Therefore, for example the first intermediate current IM provided by the stage ETG1 for a particular oscillator can be measured and compared with the desired theoretical current I1 as explained above with reference to FIG. 3. The adjustment of the number of resistors performed will then be valid for all the oscillators.

It can be the same for the adjustment RGL3 which will be carried out by measuring the frequency of this particular oscillator and by comparing it with the desired output frequency of this oscillator.

Alternatively, it would also be possible to take the sum of the intermediate currents as current.

However, the second and fourth adjustments RGL2 and RGL4 as well as the corrections COR1 and COR2, in turn, remain specific to each oscillator.

And each fourth stage ETG4i will have a division or multiplication ratio specific to the concerned oscillator.

What is claimed is:

1. An integrated circuit, comprising:
   at least one ring oscillator including a succession of inverters looped back to form a ring having an odd number of the inverters, the at least one oscillator configured to:
   operate at a desired output frequency;
   operate transistors of the inverters in or near a temperature inversion zone; and
   generate an output clock; and
   a current generator configured to provide a power current to the inverters of the at least one oscillator.

2. The integrated circuit according to claim 1, wherein the current generator is configured to provide the power current to power each inverter with a power voltage compatible with the operation of the transistors of the inverter in or near the temperature inversion zone.

3. The integrated circuit according to claim 2, wherein the power voltage is greater than a threshold voltage of the inverter and less than 1.6 times the threshold voltage.

4. The integrated circuit according to claim 2, wherein the current generator includes a current source including cascode transistors.

5. The integrated circuit according to claim 2, wherein:
   the current generator includes a command input intended to receive a command signal in a presence of which the current generator is configured to provide the power current; and the integrated circuit further comprises an adjustment module having an output connected to the command input and configured to produce the command signal based on:
at least one first measurement of a first output frequency of the at least one oscillator carried out at a first temperature; and
the desired output frequency for the at least one oscillator.

6. The integrated circuit according to claim 5, wherein the adjustment module is configured to produce the command signal from an adjustment current equal to a sum of at least:
a first intermediate current taken from a sum of an adjustable current proportional to an absolute temperature and an adjustable current inversely proportional to the absolute temperature; and
a second intermediate current equal to a first adjustable fraction of the first intermediate current.

7. The integrated circuit according to claim 6, wherein the adjustment module comprises:
a first stage including a first adjustable generator configured to generate the adjustable current proportional to the absolute temperature and a second adjustable generator configured to generate the adjustable current inversely proportional to the absolute temperature;
a second adjustable stage coupled to the first stage and configured to produce the second intermediate current;
a first adjustment circuit coupled to the first generator and to the second generator and configured to carry out a first adjustment of the current proportional to the absolute temperature, and a first adjustment of the current inversely proportional to the absolute temperature; and
a second adjustment circuit coupled to the second stage and configured to carry out a second adjustment of the first fraction;
wherein the first and second adjustments are carried out based on the first measurement of the first output frequency of the at least one oscillator carried out at the first temperature and of the desired output frequency.

8. The integrated circuit according to claim 7, wherein the second stage includes a first cascode current mirror device having an adjustable division ratio.

9. The integrated circuit according to claim 7, wherein the adjustment module is further configured to produce the command signal based on:
a second measurement of a second output frequency of the at least one oscillator, carried out at a second temperature different from the first temperature; and
the desired output frequency for the at least one oscillator.

10. The integrated circuit according to claim 9, wherein the adjustment module comprises:
a third adjustment circuit, coupled to the first generator and to the second generator, and configured to carry out a third adjustment of the current proportional to the absolute temperature, and a third adjustment of the current inversely proportional to the absolute temperature based on the second measurement of the second output frequency carried out at the second temperature and of the desired output frequency;
wherein the third adjustment circuit is configured to carry out the third adjustments in a complementary manner.

11. The integrated circuit according to claim 10, wherein the third adjustment circuit is also coupled to the second stage and are configured to correct a value of the first fraction according to the third adjustments.

12. The integrated circuit according to claim 9, wherein the adjustment module is configured to produce the command signal from an adjustment signal equal to the sum of the first intermediate current, the second intermediate current and a third intermediate current equal to a second adjustable fraction of the current proportional to the absolute temperature or of the current inversely proportional to the absolute temperature.

13. The integrated circuit according to claim 12, wherein the adjustment module comprises:
a third adjustable stage, coupled to the first generator and to the second generator, and configured to produce the third intermediate current; and
a fourth adjustment circuit, coupled to the first generator, to the second generator and to the third stage, and configured to carry out, based on the second measurement of the second output frequency of the at least one oscillator at the second temperature and of the desired output frequency:
a selection between the current proportional to the absolute temperature and the current inversely proportional to the absolute temperature; and
a fourth adjustment of a value of the second fraction of the selected current.

14. The integrated circuit according to claim 13, wherein the adjustment module further comprises a fourth stage configured to receive the adjustment signal and to provide the command signal.

15. The integrated circuit according to claim 1, comprising a plurality of ring oscillators intended to operate each at different desired output frequencies, each ring oscillator being configured so that the transistors of the inverters of the ring oscillator operate in or near the temperature inversion zone.

16. A method, comprising:
controlling an operation of at least one ring oscillator, the at least one oscillator including a succession of inverters looped back to form a ring having an odd number of the inverters;
providing a power current to the inverters of the at least one oscillator;
operating transistors of the inverters in or near a temperature inversion zone; and
generating, with the ring oscillator, an output clock.

17. The method according to claim 16, further comprising providing the power current to the inverters to power each inverter with a power voltage compatible with an operation of the transistors of the inverter in or near the temperature inversion zone.

18. The method according to claim 17, wherein the power voltage greater is than a threshold voltage of the inverter and less than 1.6 times the threshold voltage.

19. The method according to claim 17, comprising providing the power current by a current generator commanded by a command signal, and producing the command signal based on:
at least one first measurement of a first output frequency of the oscillator carried out at a first temperature; and
a desired output frequency for the oscillator.

20. The method according to claim 19, comprising producing the command signal from an adjustment current equal to a sum of at least:
a first intermediate current equal to a sum of an adjustable current proportional to an absolute temperature and an adjustable current inversely proportional to the absolute temperature; and
a one second intermediate current equal to a first adjustable fraction of the first intermediate current.

21. The method according to claim 20, comprising:
- a first adjustment of the current proportional to the absolute temperature, and a first adjustment of the current inversely proportional to the absolute temperature;
- a second adjustment of the first adjustable fraction;
- the first adjustment being carried out based on a measurement of the first intermediate current carried out at the first temperature and of a desired current, or else based on the first measurement of the first output frequency of the at least one oscillator carried out at the first temperature and of the desired output frequency; and
- the second adjustment being carried out based on the first measurement of the first output frequency of the at least one oscillator carried out at the first temperature and of the desired output frequency.

22. The method according to claim 20, comprising producing the command signal based on:
- a second measurement of a second output frequency of the oscillator, carried out at a second temperature different from the first temperature; and
- the desired output frequency for the at least one oscillator.

23. The method according to claim 22, comprising:
- a third adjustment of the current proportional to the absolute temperature, and a third adjustment of the current inversely proportional to the absolute temperature based on the second measurement of the second output frequency carried out at the second temperature higher than the first temperature and of the desired output frequency; and
- carrying out the third adjustments in a complementary manner.

24. The method according to claim 22, comprising producing the command signal from an adjustment signal equal to the sum of the first intermediate current, the second intermediate current and a third intermediate current equal to a second adjustable fraction of the current proportional to the absolute temperature or of the current inversely proportional to the absolute temperature.

25. The method according to claim 24, comprising, based on the second measurement of the second output frequency of the oscillator at the second temperature and of the desired output frequency:
- a selection between the current proportional to the absolute temperature and the current inversely proportional to the absolute temperature; and
- a fourth adjustment of a value of the second adjustable fraction of the selected current.

26. The method according to claim 21, further comprising controlling operation of a plurality of oscillators.

27. The method according to claim 26, wherein the first adjustment of the current proportional to the absolute temperature and the first adjustment of the current inversely proportional to the absolute temperature are common to all the oscillators, while the second adjustment of the first adjustable fraction is specific to each oscillator.

28. The method according to claim 26, further comprising:
- a third adjustment of the current proportional to the absolute temperature and a third adjustment of the current inversely proportional to the absolute temperature based on a second measurement of a second output frequency carried out at a second temperature higher than the first temperature and of the desired output frequency;
- the third adjustments being carried out in a complementary manner; and
- the third adjustment of the current being proportional to the absolute temperature and the third adjustment of the current being inversely proportional to the absolute temperature being common to all the oscillators and implemented based on the second measurement of the second output frequency of one of the oscillators carried out at the second temperature and of the desired output frequency of the oscillator.

29. The method according to claim 28, comprising, based on a respective measurement of a respective output frequency of each oscillator at the second temperature and of the desired output frequency for the respective oscillator:
- a selection for the respective oscillator, between the current proportional to the absolute temperature and the current inversely proportional to the absolute temperature; and
- a fourth adjustment of a value of a second adjustable fraction of the current selected for the respective oscillator.

30. The method according to claim 26, comprising:
- producing the command signal from an adjustment signal equal to the sum of the first intermediate current, the second intermediate current and a third intermediate current equal to a second adjustable fraction of the current proportional to the absolute temperature or of the current inversely proportional to the absolute temperature; and
- correcting a value of the first adjustable fraction for a respective oscillator taking into account an adjusted value of the second adjustable fraction for the respective oscillator.

* * * * *